(12) United States Patent
Howorth

(10) Patent No.: US 8,786,168 B2
(45) Date of Patent: Jul. 22, 2014

(54) MICROCHANNEL PLATE FOR ELECTRON MULTIPLIER

(71) Applicant: Jonathan Ross Howorth, Maldon (GB)

(72) Inventor: Jonathan Ross Howorth, Maldon (GB)

(73) Assignee: Photek Limited (GB)

( * ) Notice: Subject to any disclaimer, the term of this patent is extended or adjusted under 35 U.S.C. 154(b) by 0 days.

(21) Appl. No.: 13/779,118

(22) Filed: Feb. 27, 2013

(65) Prior Publication Data

US 2013/0221828 A1    Aug. 29, 2013

(30) Foreign Application Priority Data

Feb. 29, 2012   (GB) .................................. 1203562.2

(51) Int. Cl.
*H01J 43/00*     (2006.01)

(52) U.S. Cl.
USPC ................................ 313/103 CM; 313/103 R

(58) Field of Classification Search
USPC ...................................... 313/103 R, 103 CM
See application file for complete search history.

(56) References Cited

U.S. PATENT DOCUMENTS

| | | | |
|---|---|---|---|
| 3,760,216 A | 9/1973 | Lasser et al. | |
| 4,010,019 A | 3/1977 | Cole et al. | |
| 4,051,403 A | 9/1977 | Feingold et al. | |
| 5,359,187 A * | 10/1994 | Weiss | 250/214 VT |
| 5,780,961 A | 7/1998 | Power | |
| 6,040,000 A | 3/2000 | Floryan et al. | |
| 6,396,049 B1 | 5/2002 | Estrera et al. | |
| 6,803,704 B2 * | 10/2004 | Motoi et al. | 313/103 R |
| 2004/0206911 A1 | 10/2004 | Laprade | |
| 2009/0212680 A1 | 8/2009 | Tremsin et al. | |
| 2009/0215211 A1 | 8/2009 | Tremsin et al. | |
| 2009/0315443 A1 | 12/2009 | Sullivan et al. | |
| 2010/0044577 A1 * | 2/2010 | Sullivan et al. | 250/390.01 |
| 2012/0187305 A1 | 7/2012 | Elam et al. | |

FOREIGN PATENT DOCUMENTS

| | | | |
|---|---|---|---|
| GB | 1368753 A | 10/1974 | |
| GB | 1589874 A * | 5/1981 | H01J 43/28 |

OTHER PUBLICATIONS

Search Report for Great Britain Application No. GB1203562.2 dated Jan. 24, 2013; 6 pages.
Thomas, Stan and Power, Gary; "Unique Microchannel Plate Process Doubles MCPI Resolution"; 21st International Conference on High Speed Photonics; 1994; 7 pages.

* cited by examiner

*Primary Examiner* — Donald Raleigh
(74) *Attorney, Agent, or Firm* — Cantor Colburn LLP

(57) ABSTRACT

A microchannel plate (1) for a microchannel plate electron multiplier, comprising: a substrate (5) forming a plate having first and second opposing faces and having a plurality of parallel channels therethrough from first to second faces and; a first electrode (3) on the first face, the first electrode (3) having a first side adjacent to the substrate and a second side opposite to the first side; a second electrode (4) on the second face, the second electrode (4) having a first side adjacent to the substrate (5) and a second side opposite to the first side; and a layer (6, 7) of resistive and secondary emissive material on the second side of the first electrode and the second electrode.

12 Claims, 2 Drawing Sheets

MICROCHANNEL PLATE FOR ELECTRON MULTIPLIER

This invention relates to a microchannel plate for a microchannel plate electron multiplier, an electron multiplier comprising such a microchannel plate, such as typically, but non-exclusively, is used in image intensifiers, photomultipliers, vacuum instrumentation, mass spectrometers, and methods of forming and using such a microchannel plate.

The technology of making Microchannel Plate (MCP) electron multipliers is well known; see, for example, United Kingdom patent 1 368 753 and U.S. Pat. No. 4,010,019. These are usually fabricated from an array of drawn glass tubes which are chemically activated by hydrogen reduction and chemical etching. As a final step, metal electrodes are deposited on the input and output faces. It would be difficult to deposit these electrodes without some metal penetrating down inside the metal pores. Conventional wisdom and practice is to use Nickel/Chromium alloy as the electrode metal because it has a low secondary electron emission coefficient. At the output surface of the MCP, this is advantageous for imaging devices as the chance of secondary electrons being generated close to the end is reduced, and this is believed to improve spatial resolution of imaging devices using MCPs. A paper written by Stan Thomas & Gary Power "Unique Microchannel Plate Process Doubles MCPI Resolution", 21$^{st}$ International Conference on High Speed Photonics, 1994 explains this in some detail. In this paper, the authors argue that spatial resolution is improved if the metal is covered by a thick insulating layer of, for example, aluminium oxide. Similar arguments are used to justify the use of Ni-chrome at the input surface. Much research has been done to coat the metal contact at the input to improve secondary electron yield for applications where spatial resolution is unimportant.

While MCPs are commonly used for image intensifiers, there is a growing market for them as fast photomultipliers where spatial resolution is unimportant, and other parameters such as absolute detection efficiency are more important.

An alternative method of activating glass micro-capillary arrays by atomic layer deposition has been developed, as described in US patent application publications US 2009/0212680, US 2009/0315443 and US 2012/0187305, the teachings of which are incorporated by reference.

A prior art MCP is shown schematically in FIG. 1 of the accompanying drawings. The individual channels 100 can be seen; whilst the electrodes are not shown, metallic material (for example Chromium, Ni-Chrome or Inconel) has travelled down the channels as shown at 101. If an electron is incident on the MCP between the channels, as shown at position 102, then there is a high likelihood that such electrons would be lost, either by reflection, (given that the metallic electrodes with high atomic number have a high electron reflection coefficient) or because materials such as Chromium have a relatively low secondary electron emission coefficient of around 1.3 electrons per incident electron.

According to a first aspect of the invention, there is provided a microchannel plate for a microchannel plate electron multiplier, comprising:

a substrate forming a plate having first and second opposing faces and having a plurality of parallel channels therethrough from first to second faces and;

a first electrode on the first face, the first electrode having a first side adjacent to the substrate and a second side opposite to the first side;

a second electrode on the second face, the second electrode having a first side adjacent to the substrate and a second side opposite to the first side;

and a layer of resistive and secondary emissive material on the second side of the first electrode and the second electrode.

Thus, incoming electrons hitting a layer of material will generate secondary emissions, thus increasing the gain of the microchannel plate. Furthermore, electrons incident in the gaps between the channels are less likely to be reflected, thus improving the efficiency of the device.

Typically the resistive and secondary emissive material will comprise at least one of magnesium oxide (MgO) and aluminium oxide ($Al_2O_3$), optionally with a dopant present to control the resistance of the material; the dopant may be Zinc Oxide (ZnO).

Typically, each layer will be less than 100 nanometers (nm) thick, and will preferably be around 10 to 100 nanometers thick. As such, the thickness of each layer may be between 20 and 90 nm; 25 and 80 nm; 25 and 75 nm; 30 and 70 nm; 40 and 60 nm; or 50 and 60 nm thick. The thickness of each layer may be less than 10 nm, but may be at least 1 nm thick.

Typically, there would be a layer of resistive and secondary emissive material on the second side of both the first electrode and the second electrode.

The substrate may comprise a plurality of hollow glass tubes, each tube having a bore, typically of 3 to 20 microns (micrometers) in diameter, defining one of the channels. The tubes may be fused together.

Each layer of resistive and secondary emissive material may have been deposited on the first or second electrode by means of atomic layer deposition.

According to a second aspect of the invention, there is provided a method of forming a microchannel plate for use in a microchannel plate electron multiplier, the method providing a plate of a substrate having a plurality of generally parallel channels therethrough from first to second opposing faces, forming electrodes on each of the first and second faces and depositing on at least one of the electrodes a layer of resistive and secondary emissive material using atomic layer deposition.

Atomic layer deposition is a well known technique for depositing very thin layers of material of predictable thickness. However, the inventors have appreciated that it can be used to deposit an extra layer of material on top of the usual electrodes, in order that incoming electrons only encounter material with high secondary electron emission coefficient, so as to improve detection efficiency.

Typically, the step of forming the electrodes on the first and second faces will comprise using vacuum evaporation to deposit the electrodes on the faces.

According to a third aspect of the invention, there is provided a method of using the microchannel plate of the first aspect of the invention in a microchannel plate electron multiplier, comprising providing a voltage across the electrodes and exposing the layer of material on the first electrode to a source of electrons to be multiplied.

According to a fourth aspect of the invention, there is provided a microchannel plate electron multiplier, comprising the microchannel plate of the first aspect of the invention, a voltage source coupled to the electrodes so as to provide a voltage thereacross and an input for electrons to be multiplied, the layer of material on the first electrode facing the input.

There now follows, by way of example only, an embodiment of the invention, described with reference to, and as illustrated in the accompanying drawings, in which.

Figure 1:
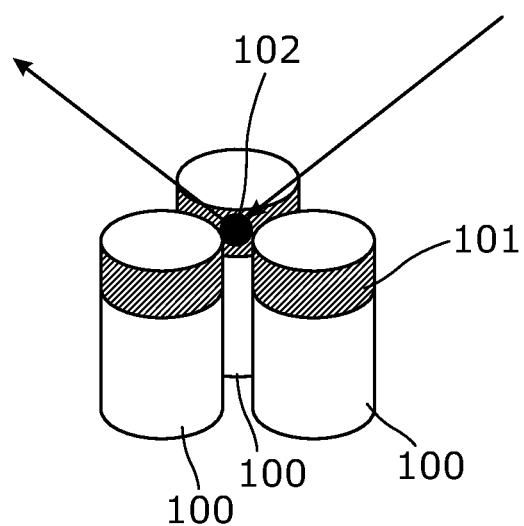
FIG. 1 shows a schematic enlargement of a prior art microchannel plate of an electron multiplier.
Figure 2:
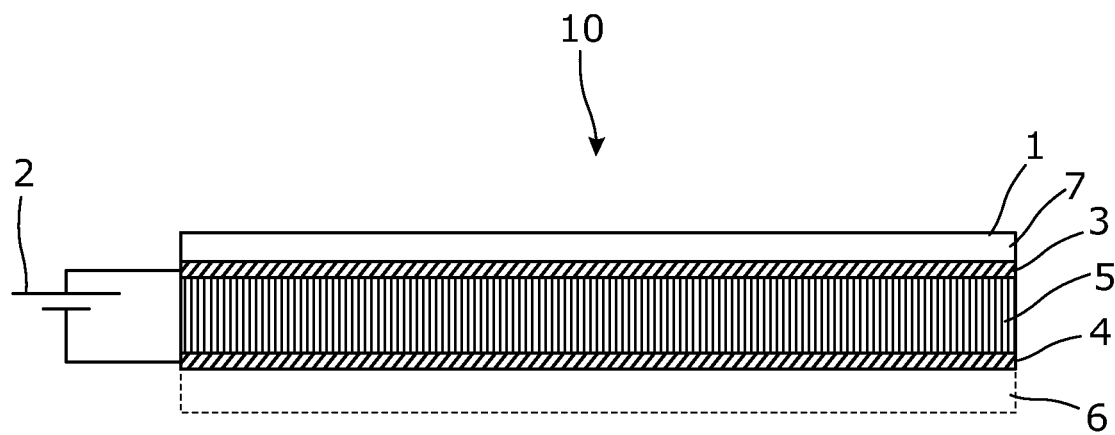
FIG. 2 shows schematically a microchannel plate electron multiplier according to an embodiment of the invention.

A microchannel plate electron multiplier according to an embodiment of the invention is shown in FIG. 2 of the accompanying drawings. The electron multiplier comprises a microchannel plate 1 and a high voltage DC voltage source 2. The electron multiplier also has an input for the electrons to be multiplied, shown schematically at 10 in FIG. 2. For example, the source of the electrons could be a photosensitive layer which emits electrons when bombarded with photons. The microchannel plate electron multiplier would generally be used in an evacuated enclosure.

The microchannel plate 2 comprises a substrate plate 5 in which are formed a plurality of parallel channels. Each channel comprises a narrow glass tube having an internal bore (the bores running vertically in FIG. 2). The bore of each tube is around 3 to 25 micrometers in diameter; the spacing of the channels centre to centre is around 20% more than the bore width, so that for a 10 micrometer bore, the spacing centre to centre will be around 12 micrometers. The tubes are fused together.

On either face of the substrate, there is deposited, typically by means of vacuum evaporation, a metallic electrode 3, 4, typically formed of Chromium, Ni-Chrome or Inconel, given its good adhesion to glass. The electrodes 3, 4 are connected to the voltage source, which can provide a voltage of up to around 2 kilovolts between the electrodes.

On top of the electrode 3 facing the electron source 10, there is provided a layer of material 7 which is resistive and provides secondary emission of electrons. Typical examples of such materials are magnesium oxide (MgO) and aluminium oxide ($Al_2O_3$). A further, layer 6 of such material is provided on the opposite electrode 4. The layers 6, 7 are formed by atomic layer deposition after the electrodes 3, 4 have been laid down. Using vacuum evaporation technology, it is easy to deposit the electrodes 3, 4 first, and to follow this with the final layers of resistive and secondary emissive material.

Thus, electrons incident from the source will only encounter material with high secondary electron emission coefficient and low resistance. Even if electrons arrive between the channels, secondary electrons will be emitted and so will generate an output pulse. Electron reflections off the input surface of the microchannel plate are reduced. Overall, the gain of the microchannel plate is improved.

Figure 3:
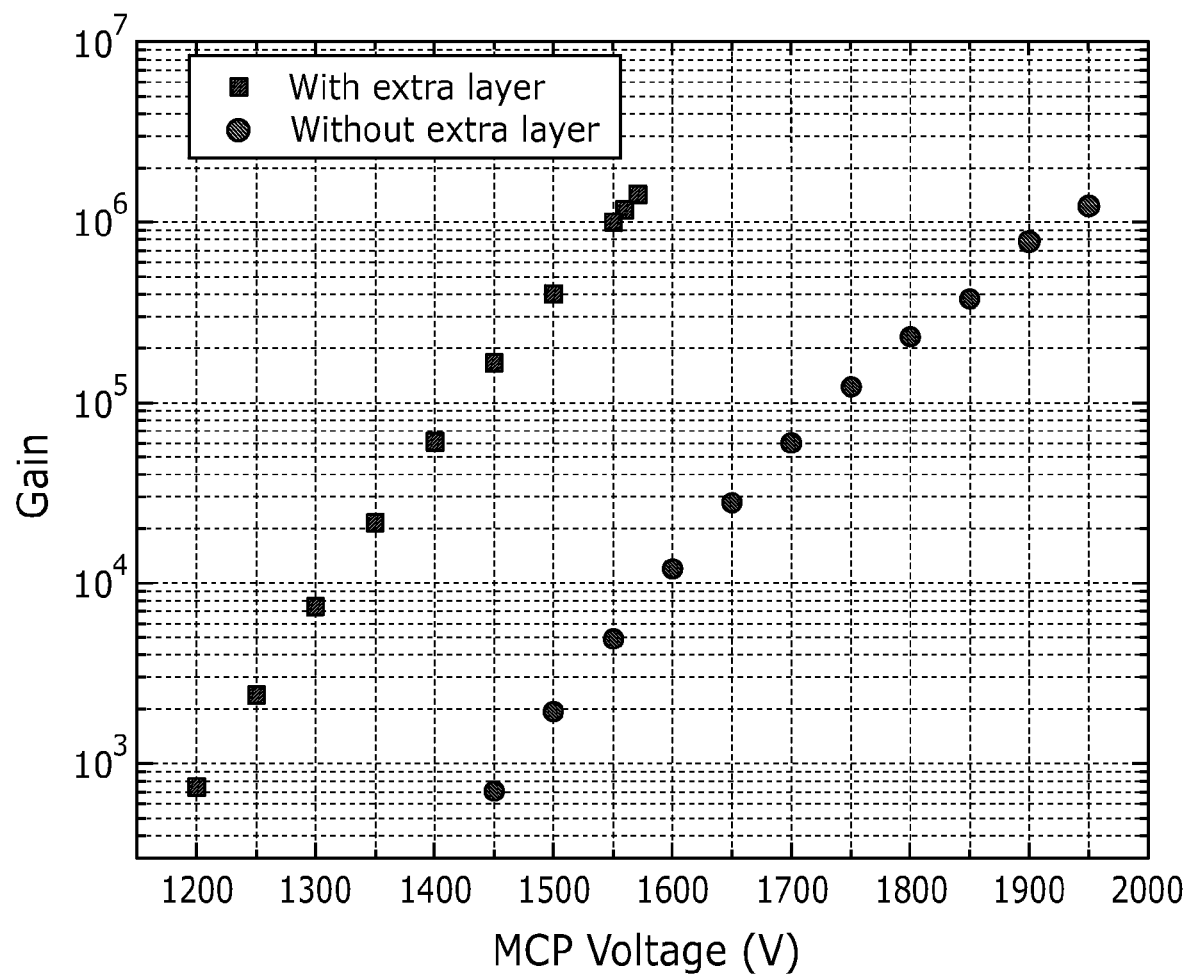
FIG. 3 shows a graph of results based upon using a microchannel plate electron multipliers according to the present embodiment and the prior art respectively.

The improvement in gain can be seen in the graph shown in FIG. 3 of the accompanying drawings, which shows the difference between a microchannel plate with and without the layer of material 7. As is apparent, there is an increase in gain of two orders of magnitude by employing the extra layer of material.

It is anticipated that the extra layer 7 will be less detrimental to resolution than conventional wisdom supposes. This is because secondary electron emission comprises two components: true secondaries, which have low energy, and therefore do not spread very far, and do not significantly degrade spatial resolution; and reflected primary electrons. Reflected primary electrons can have high energy and travel significant distances, and are known to degrade image contrast.

The ratio between true secondaries and reflected primaries is dependant on the atomic number of the material in question. The commonly used metals such as Nickel and Chromium have higher atomic number than the common secondary electron emitting materials MgO and $Al_2O_3$ commonly used for the secondary emission layers in the atomic layer deposition procedure.

Therefore, depositing using atomic layer deposition secondary emitter films on top of the metal electrodes 3, 4 can have several benefits:

Higher gain

Higher counting efficiency and better signal to noise ratio

Suppressing reflected electrons thereby improving contrast in the image

The invention claimed is:

1. A microchannel plate for a microchannel plate electron multiplier, comprising:
    a substrate forming a plate having first and second opposing faces and having a plurality of parallel channels therethrough from first to second faces and;
    a first electrode on the first face, the first electrode having a first side adjacent to the substrate and a second side opposite to the first side;
    a second electrode on the second face, the second electrode having a first side adjacent to the substrate and a second side opposite to the first side;
    and a layer of resistive and secondary emissive material on the second side of the first electrode and the second electrode, each layer of resistive and secondary emissive material configured to be deposited on one of the first and second electrodes by atomic layer deposition.

2. The microchannel plate of claim 1, in which the resistive and secondary emissive material comprises at least one of magnesium oxide (MgO) and aluminium oxide ($Al_2O_3$).

3. The microchannel plate of claim 2, in which the resistive and secondary emissive material comprises a dopant present to control the resistance of the material.

4. The microchannel plate of claim 3, in which the dopant is Zinc Oxide (ZnO).

5. The microchannel plate of claim 1, in which each layer is less than 100 nanometers thick.

6. The microchannel plate of claim 5, in which each layer is between 10 and 100 nanometers thick.

7. A microchannel plate for a microchannel plate electron multiplier, comprising:
    a substrate forming a plate having first and second opposing faces and having a plurality of parallel channels therethrough from first to second faces and;
    a first electrode on the first face, the first electrode having a first side adjacent to the substrate and a second side opposite to the first side;
    a second electrode on the second face, the second electrode having a first side adjacent to the substrate and a second side opposite to the first side;
    and a layer of resistive and secondary emissive material on the second side of the first electrode, configured to be deposited by atomic layer deposition and in which the layer is less than 100 nanometers thick.

8. The microchannel plate of claim 7, in which each layer of resistive and secondary emissive material has been deposited on one of the first and second electrodes by means of atomic layer deposition.

9. A method of forming a microchannel plate for use in a microchannel plate electron multiplier, the method providing a plate of a substrate having a plurality of generally parallel channels therethrough from first to second opposing faces, forming a plurality of electrodes on each of the first and second faces and depositing on the plurality of electrodes a layer of resistive and secondary emissive material using atomic layer deposition.

10. The method of claim 9, in which the step of forming the electrodes on the first and second faces comprises using vacuum evaporation to deposit the electrodes on the faces.

11. A microchannel plate electron multiplier, comprising a microchannel plate, the microchannel plate comprising:
- a substrate forming a plate having first and second opposing faces and having a plurality of parallel channels therethrough from first to second faces and;
- a first electrode on the first face, the first electrode having a first side adjacent to the substrate and a second side opposite to the first side;
- a second electrode on the second face, the second electrode having a first side adjacent to the substrate and a second side opposite to the first side;
- and a layer of resistive and secondary emissive material on the second side of the first electrode and the second electrode, each layer of resistive and secondary emissive material configured to be deposited on one of the first and second electrodes by atomic layer deposition;
- the microchannel plate electron multiplier comprising a voltage source coupled to the first and second electrodes so as to provide a voltage thereacross; and an input for electrons to be multiplied, the layer of material on the first electrode facing the input.

12. A microchannel plate electron multiplier, comprising a microchannel plate, the microchannel plate comprising:
- a substrate forming a plate having first and second opposing faces and having a plurality of parallel channels therethrough from first to second faces and;
- a first electrode on the first face, the first electrode having a first side adjacent to the substrate and a second side opposite to the first side;
- a second electrode on the second face, the second electrode having a first side adjacent to the substrate and a second side opposite to the first side;
- and a layer of resistive and secondary emissive material on the second side of the first electrode, in which the layer is less than 100 nanometers thick, each layer of resistive and secondary emissive material configured to be deposited on one of the first and second electrodes by atomic layer deposition;
- the microchannel plate electron multiplier comprising a voltage source coupled to the first and second electrodes so as to provide a voltage thereacross; and an input for electrons to be multiplied, the layer of material on the first electrode facing the input.

* * * * *